(12) United States Patent
White

(10) Patent No.: US 7,078,713 B2
(45) Date of Patent: Jul. 18, 2006

(54) ELECTROMAGNETIC REGULATOR ASSEMBLY FOR ADJUSTING AND CONTROLLING THE CURRENT UNIFORMITY OF CONTINUOUS ION BEAMS

(76) Inventor: Nicholas R. White, 9 Spy Rock Hill, Manchester, MA (US) 01944

( * ) Notice: Subject to any disclaimer, the term of this patent is extended or adjusted under 35 U.S.C. 154(b) by 163 days.

(21) Appl. No.: 10/807,770

(22) Filed: Mar. 24, 2004

(65) Prior Publication Data
US 2005/0017202 A1 Jan. 27, 2005

Related U.S. Application Data
(60) Provisional application No. 60/458,672, filed on Jul. 24, 2003.

(51) Int. Cl.
*H01J 37/317* (2006.01)

(52) U.S. Cl. .................. 250/492.21; 250/492.2; 250/492.3; 250/281; 250/282; 250/298; 250/396 R

(58) Field of Classification Search ............ 250/492.21, 250/492.2, 492.3, 281, 282, 298, 396 R
See application file for complete search history.

(56) References Cited

U.S. PATENT DOCUMENTS

| | | | | |
|---|---|---|---|---|
| 5,483,077 | A | * | 1/1996 | Glavish .................. 250/492.2 |
| 6,703,628 | B1 | * | 3/2004 | Ye et al. ................ 250/492.21 |
| 6,835,930 | B1 | * | 12/2004 | Benveniste et al. ......... 250/298 |
| 2003/0205683 | A1 | * | 11/2003 | Benveniste ............ 250/492.21 |

\* cited by examiner

*Primary Examiner*—Nikita Wells
(74) *Attorney, Agent, or Firm*—David Prashker

(57) ABSTRACT

An electromagnetic regulator assembly for the production of contiguous magnetic fields which are applied to a continuous ion beam is described. The assembly is structured for controlling the uniformity of traveling continuous ribbon-shaped beams; and allows for direct adjustment of the magnetic field gradient of the magnetic field as the parameter for increasing the current uniformity.

11 Claims, 12 Drawing Sheets

US 7,078,713 B2

ELECTROMAGNETIC REGULATOR ASSEMBLY FOR ADJUSTING AND CONTROLLING THE CURRENT UNIFORMITY OF CONTINUOUS ION BEAMS

PRIORITY CLAIM

The present invention was first filed as the subject matter of U.S. Provisional Patent Application Ser. No. 60/458,672 filed Jul. 24, 2003 entitled "ION BEAM CONTROL ARRANGEMENT".

FIELD OF THE INVENTION

This invention is concerned generally with controlling the uniformity of charged particles within an ion beam. More particularly, the invention is directed to the production of more uniform ribbon-shaped continuous ion beams; provides an apparatus and method for adjusting the current density of charged particles in such continuous beams; and presents an assembly for controlling the current uniformity along one transverse direction of parallel, ribbon-shaped, continuous ion beams which are pointed at a target plane for treating prepared workpieces with charged ions—e.g., an ion implanter for doping silicon wafers or flat-panel display substrates, where the ion beam uniformity must be controlled with great precision.

BACKGROUND OF THE INVENTION

In the field of processing materials with ion beams, various techniques have been developed for producing large, approximately-parallel ribbon ion beams with controlled current uniformity. In this context, the term 'controlled' is understood to mean that the current density along the long transverse dimension (the target direction or travel axis) of the beam adheres to a desired profile, which may be uniform (i.e., homogeneous, symmetrical, or regular) or may be variable and non-uniform (i.e., heterogeneous, asymmetrical, or irregular) in a predetermined manner or a pre-chosen pattern (such as a left-right linear ramp).

Examples of ion implanters which employ a continuous ribbon beam, but which omit any active means of controlling the uniformity, can be found. Many of these also omit any means of analyzing the ion beam so as to remove contaminant species. For examples, see Armini et al., "Non-Mass-Analyzed Solar Cell Ion Implanter", in *Nucl. Instr. and Meth*, B6 (1985), p. 94, Elsevier, North Holland.

Among the conventionally available assemblies and techniques for controlling the current density uniformity of ion beams are the following:

(i) The invention disclosed by U.S. Pat. No. 5,350,926 teaches the use of magnets for analyzing, shaping and rendering parallel an ion beam as well as the use of multipole elements (either integrated into bending magnets or as separate assemblies) for controlling the uniformity of the beam.

(ii) In a commercial implantation system sold by Varian Semiconductor Equipment Associates Inc. (known as the "VIISta-80 ion implanter"), the physical movement of members of a discrete set of pole pieces within a deflection magnet produces variations in a local dipole field component lying normal perpendicular) to the long dimension of the ribbon beam and to its direction of travel.

(iii) In a commercial implanter sold by Mitsui Engineering and Shipbuilding (the MDI-100), a discrete multipole device is presented as a rectangular array of iron pole pieces mounted on a yoke which surrounds the ion beam. Each pole piece is individually excited by a separate coil wound around it. The resulting magnetic field is applied in the central rectangular aperture, through which the ribbon-shaped ion beam passes; and consists of spatially varying dipole components, which cause a local slight deflection of the trajectories for the ions passing through it. Subsequently, at a processing plane downstream from the multipole device, the trajectory deflections produce a characteristic variation in the current density for the ion beam, in which one region typically exhibits a decrease in ion density while a neighboring region exhibits an increase in ion density. See for example, U.S. Pat. Nos. 5,834,786 and 5,350,926 for additional details of this arrangement.

(iv) Algorithms for adjusting multipole devices to achieve a greater degree of current density uniformity have been developed by Diamond Semiconductor Group Inc. and are typically used in the manufacture of their commercial products. However, such algorithms are very complicated in their specifics; and are quite difficult to implement in practice as a functional part of an ion implantation system.

(v) One conventionally known format of a multipole lens [e.g., Banford, in *The Transport of Charged Particle Beams*, Spon, 1960] is shown by Prior Art FIG. 1. As seen therein, the multipole lens is conceived with rotational symmetry. The magnetic field generated therein can be expressed in terms of cylindrical harmonics, and is best described using a polar coordinate system. Such lenses are used in various applications of generally cylindrical ion beams, such as electron microscopes and accelerators, where they can control aberrations of the system optics.

(vi) Attention should also be given to the "Panofsky" quadrupole lens design described by Banford [in *The Transport of Charged Particle Beams*, Spon, 1960] and illustrated by Prior Art FIG. 2. This multipole format uses a closed rectangular yoke of iron to make a quadrupole lens for a beam of high aspect ratio. The windings on the two long member pieces of the yoke, which extend in one direction, must carry the same ampere turns (but in the opposite sense) to the two windings on the short member pieces that close the yoke and are oriented in the other direction. Both pairs of windings must be uniform in cross section in order to generate a uniform field gradient within the central region. The windings on oppositely positioned sides of the yoke are electrically excited to yield a zone of linearly varying magnetic field, i.e. $dB_y/dx = -dB_x/dy$, which is approximately constant within the space bounded by the coils.

(vii) Another previously known format is the "Cartesian" multipole lens of White et al. [disclosed in the IIT '98 conference published by IEEE] which conforms to the shape of a ribbon beam, and is illustrated by Prior Art FIGS. 3 and 4 respectively. The device (shown in cross-sectional view by FIG. 3 and in a detailed sectional view by FIG. 4) is a rectangular multipole lens which conforms to the shape of a ribbon beam in order to control its uniformity; and is often referred to as a Cartesian multipole—since it is best described in Cartesian coordinates, rather than by polar coordinates. Accordingly, this multipole lens produces a field component "$B_y$," whose variation along the x-axis can be controlled directly, by varying the current of the coils at different x-coordinates, with a resolution determined by the pitch of the coils and poles. Prior Art FIG. 5 shows the effect of exciting a single pair of coils within this "Cartesian" multipole on an otherwise uniform ion beam.

In most types of systems using continuous ribbon beams, provision is made to move the workpiece to be implanted through the ion beam, in the direction of its short dimension, at a controlled velocity effective to achieve the correct dose of ions. In some systems a single passage is used, and in others each workpiece moves multiple times through the ion beams. The advantage offered by this technique is that minor beam size fluctuations in the y-axis direction have no net effect on the uniformity of the processing.

Overall therefore, many of these previously known structures and conventional ion implantation systems have been commercially utilized; have been technically successful in some meaningful degree; and have been reported within the technical literature with complete descriptions of their use and manner of operation. It is noteworthy, however, that the multipole structures within all these known systems all have been designed to provide a magnetic field whose strength is controlled as a function of the x-coordinate/dimension of the flowing ion beam. In addition, they often require involved software algorithms to operate; and, in general, are beyond the competence of a modestly skilled operator to understand fully or to control effectively.

For these reasons, there remains a well recognized and long standing need for the development of an assembly which would provide the user with the capability of adjusting a single operational control in order to raise or lower the current density at will in a single defined zone (relative to that in the remainder of the beam), with minimal complicating side effects. Desirably also, such an improved assembly for adjusting current density uniformity of a continuous ion beam would be simple and intuitive to operate; would be of simplified design and construction; and would markedly reduce the power consumption and heat load of ion implanters generating a ribbon-shaped, charged particle continuous beams.

SUMMARY OF THE INVENTION

The present invention has multiple aspects. A first aspect provides, in an ion implanter apparatus including a source for the generation of charged particles as a continuous ion beam, means for directing the continuous ion beam in a desired direction, and a plane surface for the implantation of charged particles in the continuous ion beam into a prepared workpiece, the improvement of an electromagnetic regulator assembly for adjusting and controlling the uniformity of charged particles in a continuous ion beam, said regulator assembly comprising:

a linear multipole array comprised of
  (i) a straight support rod comprising ferromagnetic material and having a predetermined length and girth, and
  (ii) an array of at least two wire coils wound independently and positioned adjacently at pre-chosen sites on said support rod, each of said wire coils being formed of electrically conductive matter and being wound to lie orthogonal to said straight support road;

a boundary plate presenting a plane surface which is positioned to lie parallel to and at a preset gap distance from said linear multipole array, said boundary plate being of predetermined dimensions and configuration and comprising ferromagnetic material;

on-demand means for passing electrical energy of variable current independently through each adjacently positioned wire coil on said support rod, whereby each adjacently positioned and energized wire coil independently generates an orthogonally extending and individually adjustable zone of magnetic field gradient of limited breadth, and whereby said plurality of adjacently extending zones of magnetic field gradient of limited breadth collectively form a contiguous magnetic field, and whereby each zone of magnetic field gradient of limited breadth within said contiguous magnetic field can be individually altered at will to yield an adjustable and controllable magnetic field gradient over said contiguous magnetic field; and a circumscribed spatial passageway for applying a contiguous magnetic field to and adjusting and controlling the magnetic field gradient of an applied contiguous magnetic field for a continuous ion beam traveling therethrough, wherein said spatial passageway is dimensionally circumscribed in a x-axis direction by said array of wire coils in said linear multipole array and in a y-axis direction by said gap distance separating said multipole array from said plane surface of said boundary plate, and wherein the degree of uniformity for the charged particles of a continuous ion beam becomes adjusted and controlled.

A second aspect of the present invention provides, in an ion implanter apparatus including a source for the generation of charged particles as a continuous ion beam, means for directing the continuous ion beam in a desired direction, and a plane surface for the implantation of charged particles in the continuous ion beam into a prepared workpiece, the improvement of an electromagnetic regulator assembly for adjusting and controlling the uniformity of charged particles in a continuous ion beam, said regulator assembly comprising:

a first linear multipole array comprised of
  (i) a straight support rod comprising ferromagnetic material and having a fixed length and girth, and
  (ii) an array of at least two wire coils wound independently and positioned adjacently at pre-chosen sites on said support rod, each of said wire coils being formed of electrically conductive matter and being wound to lie orthogonal to said straight support road;

a second linear multipole array which is in correspondence with said array of wire coils and lies at a preset gap distance from said first linear multipole array, said second linear multipole array being comprised of
  (a) a straight support rod comprising ferromagnetic material and having a fixed length and girth, and
  (b) an array of at least two wire coils wound independently and positioned adjacently at pre-chosen sites on said support rod, each of said wire coils being formed of electrically conductive matter and being wound to lie orthogonal to said straight support rod;

on-demand means for passing electrical energy of variable current independently and concurrently through each adjacently positioned wire coil on said each of said support rods of said first and second multipole arrays, whereby each adjacently positioned and energized wire coil independently and concurrently generates an orthogonally extending and individually adjustable magnetic field gradient of limited breadth between said first and second linear multipole arrays, and whereby said plurality of adjacently extending magnetic field gradients of limited breadth collectively form a contiguous magnetic field between said first and second linear multipole arrays, and whereby each magnetic field of limited breadth within said contiguous magnetic field can be individually and concurrently altered at will to yield an adjustable and controllable magnetic field gradient over said contiguous magnetic field; and a circumscribed spatial passageway existing between said first and second linear multipole arrays for applying a contiguous magnetic field to and adjusting and controlling the magnetic field gradient of an applied contiguous magnetic field for a continuous ion beam traveling therethrough, wherein said spatial passageway is dimensionally circumscribed in a x-axis direction by said fixed length of said support rods of said first and second linear multipole arrays, and in a y-axis direction by said preset gap distance separating the coils of said first linear multipole array from the coils of said second linear multipole array, and wherein the degree of uniformity for the charged particles of a continuous ion beam becomes adjusted and controlled.

BRIEF DESCRIPTION OF THE FIGURES

Prior Art

Prior Art

Prior Art

Prior Art

Prior Art

DETAILED DESCRIPTION OF THE INVENTION

Figure 1:
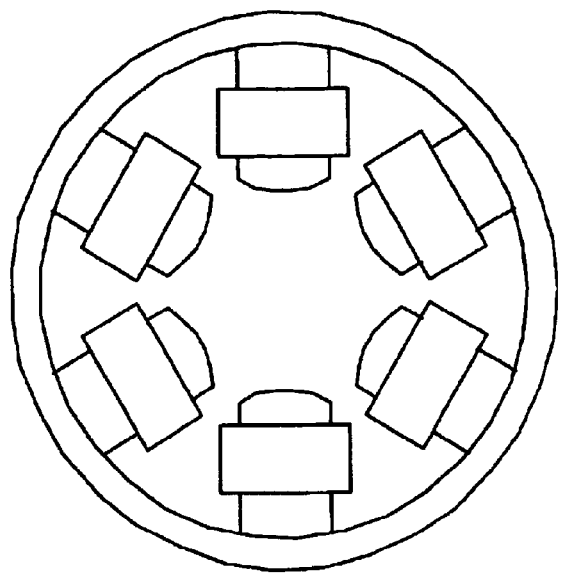
FIG. 1 shows a conventional sextupole lens for an ion beam.

The present invention is an electromagnetic regulator assembly which can adjust and control the degree of uniformity for charged particles traveling within a continuous ion beam. The invention comprises an article of manufacture and a method for adjusting the concentration of charged particles carried in such continuous ion beams. The instant invention thus provides an effective arrangement and means for controlling the uniformity of the ion current along the transverse direction of ribbon-shaped, continuous beams which are targeted at a plane of implantation or a work surface for the placement of charged ions into a prepared workpiece (such as a silicon wafer), which is passed through the beam orthogonal to its long direction in order to implant the whole of one face of the workpiece.

I. Definitions

In order to avoid inconsistencies in terminology, eliminate ambiguities in denotative and connotative meanings, and to increase the clarity and completeness of comprehension and understanding, a set of carefully recited definitions are presented below. These terms and jargon will be employed consistently and repeatedly herein to describe and claim the present invention in a manner that not only sets forth what the present invention is and how it is to be made and used, but also separates and distinguishes the inventive subject matter from what it is not.

Ion beam: Any beam of charged particles, including electrons, positive or negative ions, molecules, clusters, or subatomic particles.

Ribbon beam: An ion beam having a cross section characterized by a long dimension and a short dimension, the long dimension being at least twice the short dimension, and usually at least five times the short dimension. The long dimension is usually larger than a dimension of the face of the workpiece to be processed with the beam Continuous ribbon beam: A ribbon beam in which the current at any point is uninterrupted for at least the time required to process one workpiece. (In contrast, a scanned ribbon beam is a smaller beam scanned within a ribbon-shaped envelope, and at any one point in the envelope the beam will be interrupted twice in each scan).

x, y, and z coordinates (or axes): The z coordinate (or axis) is the intended direction of travel for the ion beam. The x-axis is aligned with the larger cross sectional dimension of the intended beam. The y-axis is aligned with the smaller cross sectional dimension of the intended beam.

Downstream: The travel pathway or the targeted angle and direction of the ion beam.

Upstream: Opposite to the travel pathway or 180 degrees from the targeted angle and direction of the ion beam.

Adjusting an ion beam: Altering the current density along the long dimension (the target direction or travel pathway axis) of the beam so as to adhere to a desired profile.

Controlling an ion beam: Maintaining a desired current density along the long dimension (the target direction or travel pathway axis) of the beam so as to adhere to a desired profile.

Uniform ion beam: A concentration of charged particles within an ion beam which is substantially consistent, homogeneous, symmetrical, or regular in cross-sectional profile.

Non-uniform ion beam: A concentration of charged particles within an ion beam which is substantially inconsistent, heterogeneous, asymmetrical, or irregular in cross-sectional profile.

II. Substantive Differences of the Present Invention Compared to Conventionally Known Multipole Lens First, using the regulator assembly comprising the present invention, it is not necessary or desirable to control the magnetic field value "$B_y$" directly; but instead the requirement of the invention is for an effective control of the magnetic field gradient parameter "$dB_y/dx$". This is a marked difference and change from conventionally known structures.

In ion and electron optics, a region of uniform field deflects the beam as a whole. Thus, a region of non-uniform magnetic field will deflect different parts of the beam by different amounts, and give rise to focusing or defocusing. It is the magnetic field gradient which determines the focusing strength. A region where the field causes slight focusing of the ion beam will give rise to an increase in ion density at a downstream location. Conversely, a region of defocusing will cause a reduction in ion density downstream.

Second, it is well known that a region of uniform magnetic field gradient, $dB_y/dx$, must also have a corresponding term, $dB_x/dy$, of equal and opposite magnitude (Maxwell's curl equation). From this mathematical equation, it follows that a region of non-uniform field configured to focus a beam in the x-axis direction must also defocus the beam simultaneously in the y-axis direction.

This unavoidable linkage of orthogonal directions (x-axis and y-axis) has led to the failure of attempts to control of the uniformity of an ion beam in two dimensions, the x and y axes; and eventually resulted in a one-dimensional system arrangement in which the corresponding variation of the beam in the y-axis dimension (and corresponding ion density) was deemed to be of no material concern—because the implanted workpiece would then be moved through the beam in the y-axis direction and thereby effectively integrate the beam current in that single dimension. However, no conventional multipole structure to date has been used which can effectively adjust or control the field gradient of a magnetic field as an operational parameter during the ion implantation process.

Third, where a focusing of the ion beam is desired, it is considered most advantageous to control directly the $dB_y/dx$ parameter. For example, where the control (or conversely, an intentional creation) of ion current aberrations is desired, it is best to adjust directly the variation of $dB_y/dx$ within a given spatial zone.

Similarly, for effective maintenance and control of ion current uniformity along a single axis or dimension, it is desirable to control $dB_y/dx$ at a plurality of different points or spatial zones along a line in the x-axis direction, the structural assembly being so designed that $dB_y/dx$ varies smoothly between any two zones and among all the different regional points of the spatial passageway through which the ion beam travels. It would be also highly desirable, but not essential for this purpose, for the values of $B_x$ and $B_y$ respectively to be zero (null) at the estimated or approximate center of the ion beam.

Figure 2:
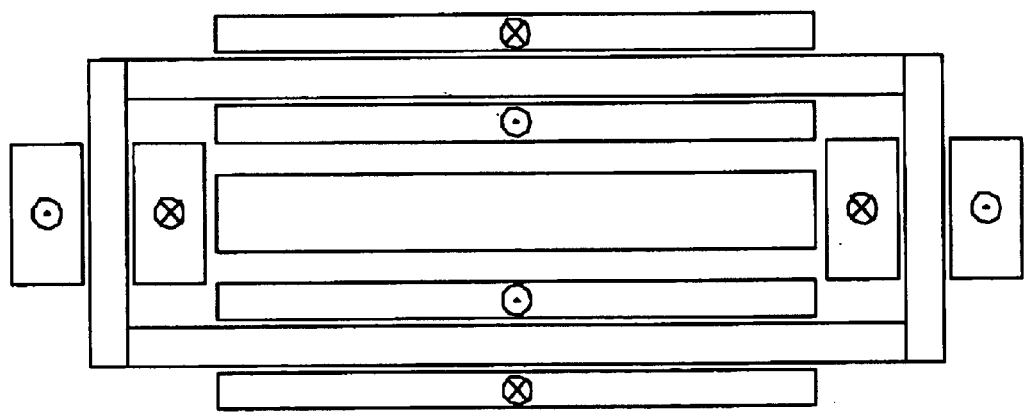
FIG. 2 shows a 'Panofsky' quadrupole.
Figure 3:
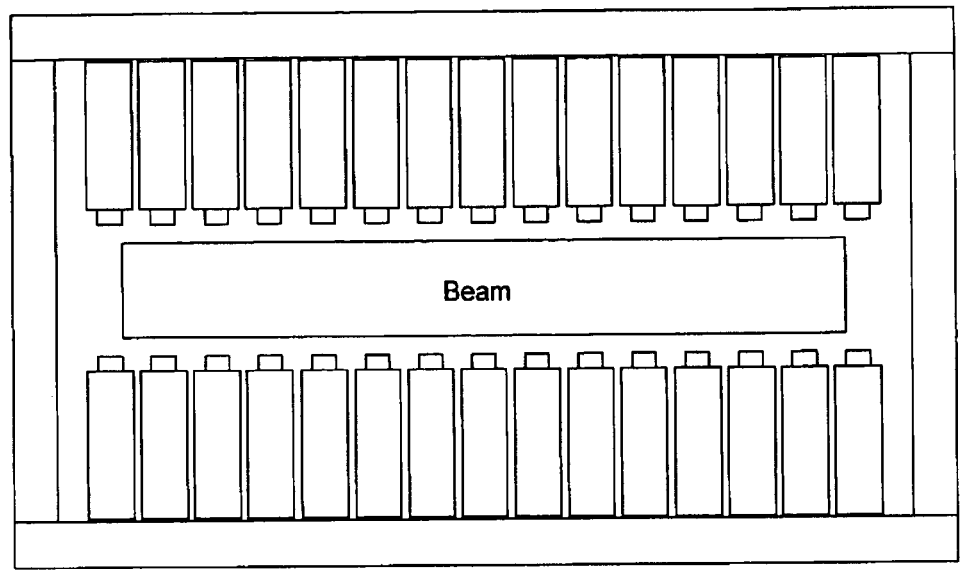
FIG. 3 shows a cross-sectional view of a 'Cartesian' multipole of White et al. which is used for controlling beam uniformity.

The present invention achieves and provides the user for the first time with the capability of direct adjustment and control of the magnetic field gradient $dB_y/dx$ as an operational parameter via its unique structural arrangement. The unique arrangement of the regulator assembly also provides a substantial simplification of construction and singular assembly, which is markedly different and distinct from the conventional devices illustrated herein by Prior Art FIGS. 1, 2 and 3; and, in many instances, will require substantially less electric current in order to adjust and control the uniformity of the charged particles in the beam and achieve a useful profile. Furthermore, the usual internal variations in magnetic field strength and in magnetic field gradient are controlled and made considerably smoother with an array of coils in contact end-to-end than was previously possible by the Cartesian Multipole devices of the prior art.

III. Electromagnetic Regulator Assembly Comprising the Present Invention

The subject matter as a whole comprising the electromagnetic regulator assembly is most easily understood with particular reference to the differences between the coordinate system used in prior art devices and the coordinate framework of the present invention as described herein. For the reader's convenience, the z-axis is presumed to exist at and run down the approximate center of the ion beam as it travels along its intended pathway; and the term 'downstream' signifies a location in the moving direction and pathway of the continuous ion beam as it travels from its source towards the targeted workpiece.

The regulator assembly and the manner of its use comprise the subject matter as a whole of the present invention. The assembly provides at least one linear multipole array for the generation of a contiguous magnetic field of known strength and profile; and includes a circumscribed spatial passageway which typically is of rectangular shape, has set spatial dimensions, and encompasses and bounds (using x-axis and y-axis coordinates) the entirety of a continuous ion beam (then traveling in the z-axis). The generated contiguous magnetic field of predetermined strength is generated and aligned within the confines and dimensions of the circumscribed spatial passageway. However, unlike prior art devices, the present invention is so structured and designed that the magnetic field gradient, $dB_y/dx$, of the contiguous magnetic field can be directly adjusted and controlled at will; and such at will adjustments and control of the magnetic field gradient is achieved by varying the electric current(s) to individual and different parts of the linear multipole array; and consequently altering the strength of the magnetic field gradient within carefully selected spatial zones and/or regions within the total volume encompassed by the circumscribed spatial passageway.

A. The Simplest Construction

Structural Elements of the Construction

Figure 6:
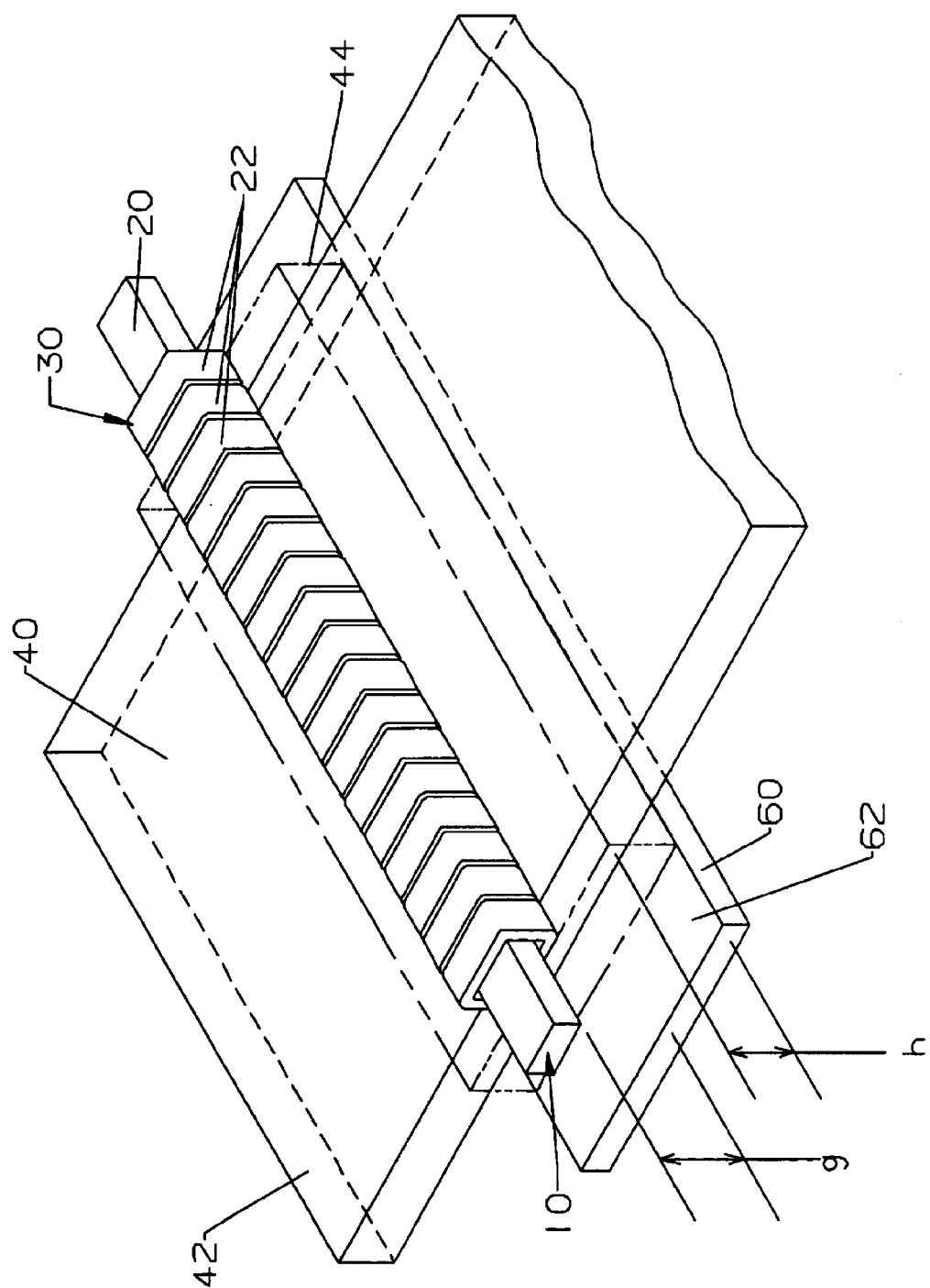
FIG. 6 shows a perspective view of the simplest construction for the regulator assembly of the present invention.
Figure 7:
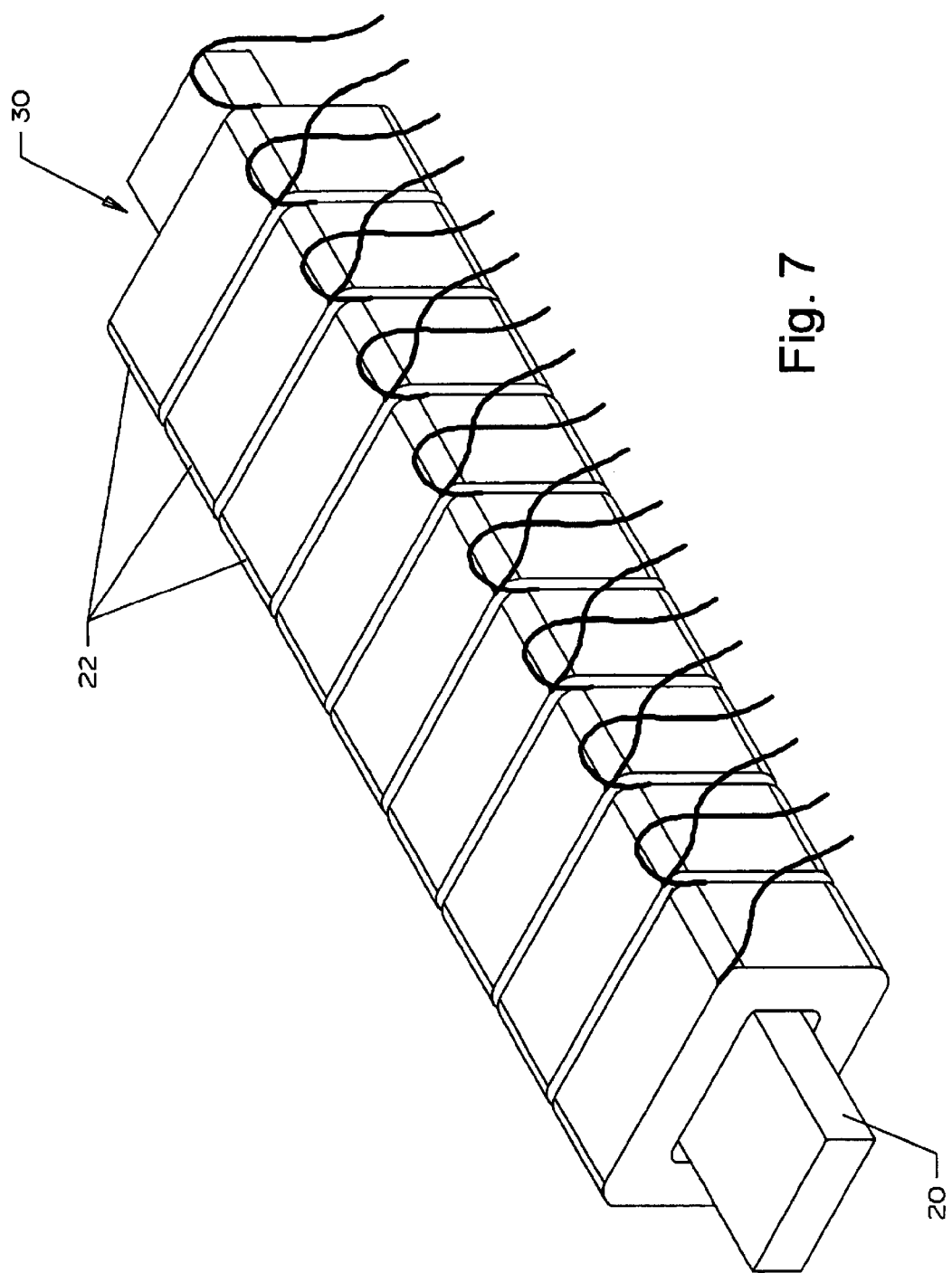
FIG. 7 shows a perspective view of a single multipole coil array in the regulator assembly of FIG. 6.

The simplest embodiments of the present invention are exemplified and illustrated by the assembly of FIGS. 6 and 7 respectively. As seen therein, the regulator assembly 10 comprises a straight ferromagnetic rod 20 of fixed length and girth sized to be somewhat longer in length than the x-axis dimension of the continuous ion beam to be controlled; and oriented to lie parallel to and at a preset gap distance from a boundary plate 60 having a plane surface 62. The straight ferromagnetic rod 20 serves as a support bar around which a plurality of individual wire coils 22 are separately and independently orthogonally wound. These orthogonally wound wire coils 22 are independently and adjacently placed in series at a number of predetermined and different locations uniformly spaced over most of the length of the support rod 20; and collectively constitute a series of individual, separate and adjacently positioned single wire coils 22 aligned with the x-axis for the multipole coil array 30.

Mounted parallel to and oriented with the x-axis direction of the multipole coil array 30 is a boundary plate 60, which presents a plane surface and is positioned to lie parallel to and at a preset gap distance 44 from the multipole coil array 30. The boundary plate 60 is of predetermined dimensions and configuration, and is comprised of ferromagnetic material.

Lying between the multipole coil array 30 and the boundary plate 60 is a spatial passageway 40 which circumscribes a continuous ion beam therethrough; and provides a confined zone for applying a magnetic field and for adjusting and controlling the magnetic field gradient of a contiguous magnetic field applied to a continuous ion beam. The spatial passageway 40 is limited in its breadth dimension 42 in x-axis direction by the linear length of the multipole coil array 30; and is dimensionally confined in a y-axis direction by the preset gap distance 44 separating the supporting rod 20 of the linear multipole array 30 from the plane surface 62 of the boundary plate 60. It is within the circumscribed spatial passageway 40 that a controlled magnetic field is generated and applied; that the gradient of the magnetic field can be adjusted by separate zones and regions; and that the degree of uniformity for the charged particles of a continuous ion beam becomes adjusted and controlled.

A component part of the overall regulator assembly are on-demand means (not shown) for introducing electrical energy of variable current independently through each individual wire coil 22 orthogonally disposed along the fixed length of the support rod 20. Given the flow of electrical energy of an appropriate current, each adjacently positioned and energized wire coil 22 independently generates an orthogonally extending and individually adjustable magnetic field of limited breadth; and the plurality of adjacently extending magnetic fields of limited breadth collectively form a contiguous magnetic field; and the strength of each magnetic field of limited breadth within the contiguous magnetic field can be individually altered at will (by varying the electrical current) to yield an adjustable and controllable magnetic field gradient over the entirety of the contiguous magnetic field. The method of adjustment is fully described below.

Figure 4:
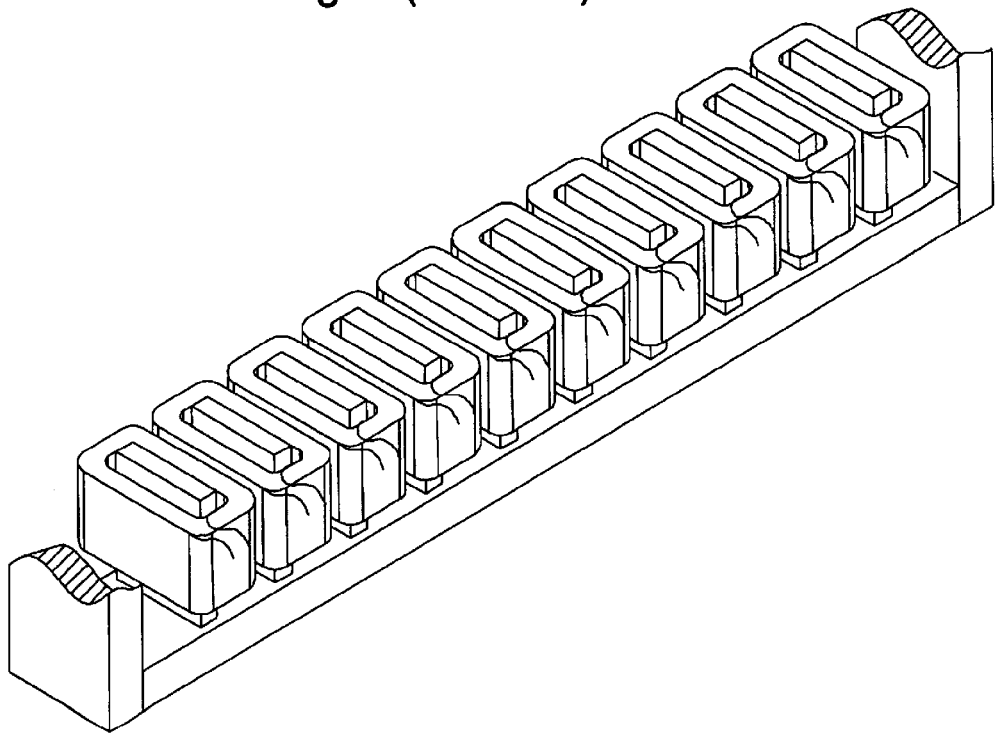
FIG. 4 shows an overhead detailed sectional view of the 'Cartesian' multipole of FIG. 3.
Figure 5:
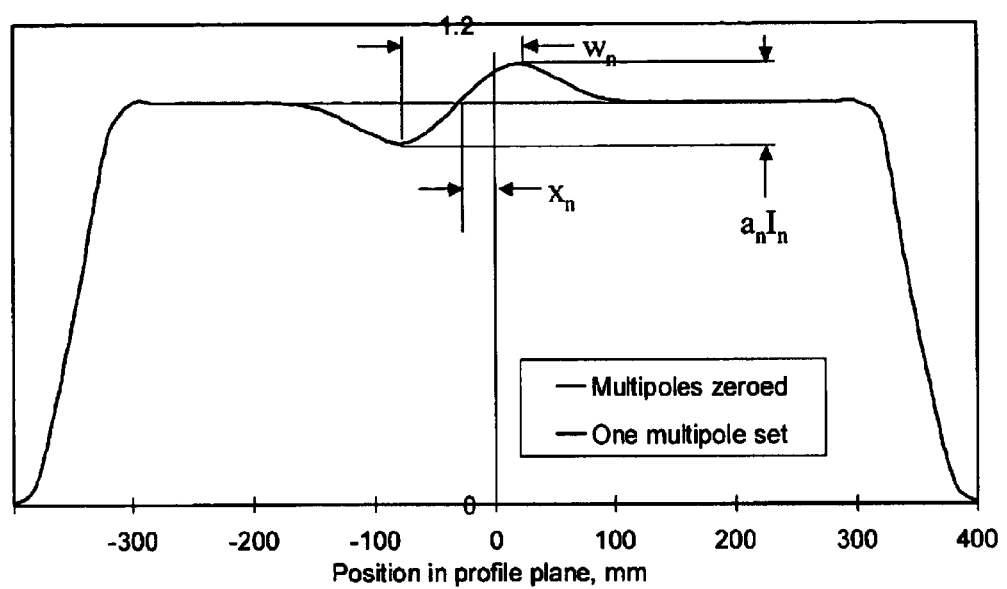
FIG. 5 shows the effect of exciting a single pair of coils in the 'Cartesian' multipole of FIG. 4 on an otherwise uniform ion beam.
Figure 17:
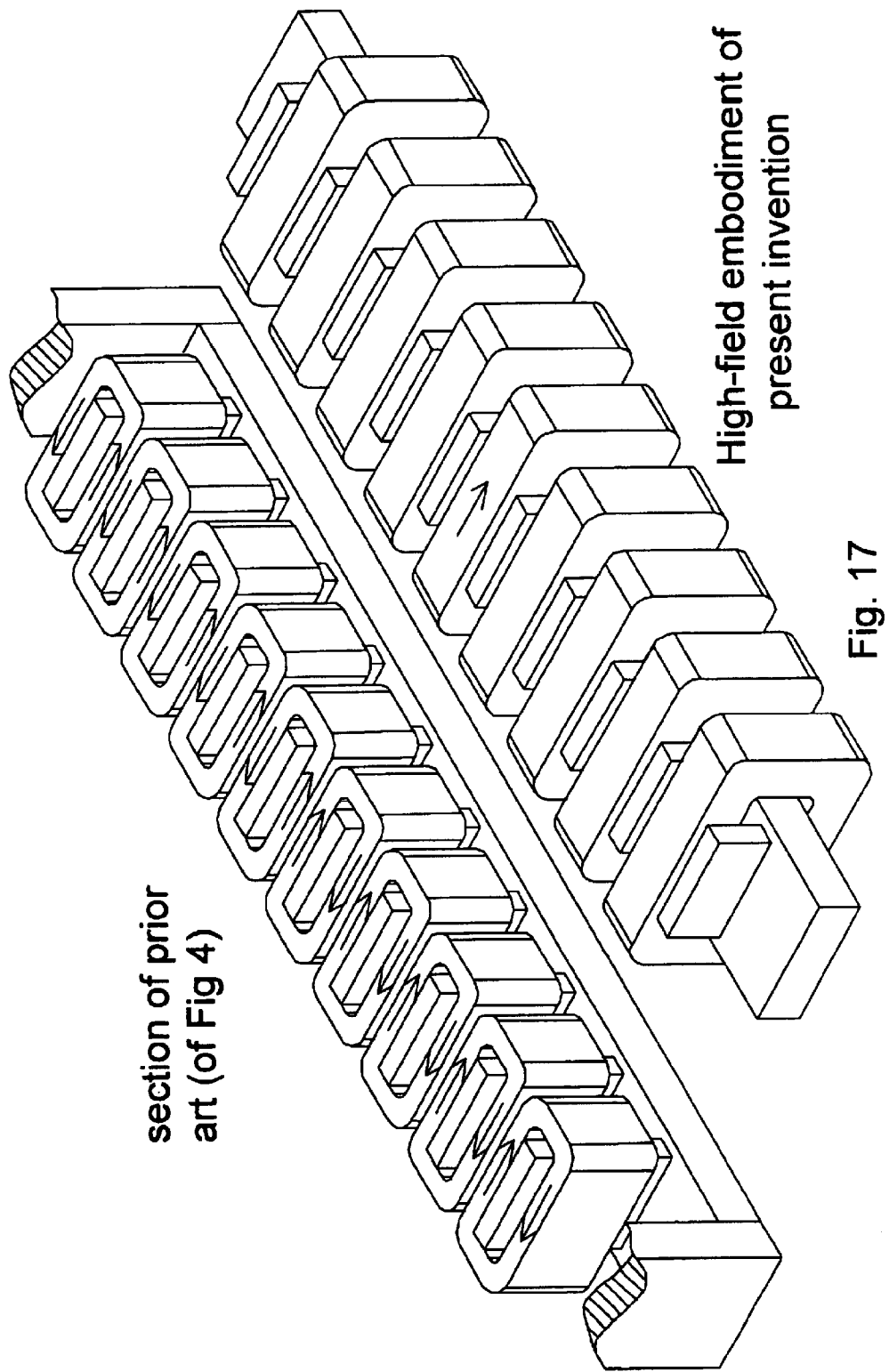
FIG. 17 shows the structural differences between the orthogonally wound and positioned wire coils of the present invention and the coils of the prior art structure of FIGS. 3 and 4.

It will be noted and appreciated, as shown by FIG. 7, that the aligned series of multiple individual wire coils 22 constitute a multipole array 30 in which each wire coil is orthogonally wound and is orthogonally set at a different fixed position along and over the sized length of the ferromagnetic support rod; and, as shown by FIG. 6, comprises an array 30 which is congruent with (i.e., coincides exactly when superimposed) and encompasses the breadth dimension 42 of the spatial passageway 40, through which the continuous ion beam travels in-situ. The orthogonal winding and positioning feature of the individual wire coils 22 illustrated by FIGS. 6 and 7 is thus a unique and singular orientation; and is markedly different and distinguishable from the coiled windings of the previously known multipole lens structure illustrated herein by Prior Art FIGS. 3 and 4 respectively. FIG. 17 herein plainly shows the marked differences of the orthogonally wound and positioned coils of the present invention in comparison to the different orientation and winding of the coils in the conventional multipole structure of Prior Art FIGS. 3 and 4 respectively.

Also, the multipole coil array 30 is preferably mounted by means of non-magnetic supports to lie parallel to the plane surface 62 of the boundary plate 60; and a preset gapped distance 44 exists between the wire coils 22 and the plane surface 62. This preset gapped distance 44 exists between the wire coils 22 and the plane surface 62. This preset gapped distance 44 defines two of the sides of the rectangular shaped spatial volume of the passageway 40 into which the magnetic field is directed. The ferromagnetic material of the boundary plate 60 and the plane surface 62 provides a set boundary limit at which the magnetic field lines are constrained to be orthogonal with respect to the x-axis multipole coil array. Accordingly, the intervening spatial volume through which the continuous ion beam will travel (in the z-axis direction) is contained within and circumscribed by the breadth distance 42 which represents the x-axis dimension and the gap distance 44 which represents the y-axis dimension.

The Underpinnings of the Method for Using the Regulator Assembly

As noted herein previously, FIGS. 6 and 7 shows that the plane surface 62 of the boundary plate 60 lies parallel to the y=0 plane. The multipole coil array 30 has individual wire coils 22 wound orthogonally around the ferromagnetic rod 20 and placed separate from but adjacent to each other at predetermined locations over the linear length of the rod. If different electric currents are passed through each wire coil 22, the field gradient close to the plane surface 62 will vary smoothly; but for the field gradient closer to the coils, the variation is less smooth. It would be possible to shape the abutting regions of the wire coils 22 to make smoother the change in current density and the resulting change in magnetic field gradient, but this effort is deemed to be unnecessary in practice.

Rather, it is sufficient and more practical that the charged particles in the continuous ion beam flowing from its source are made to pass in the z-axis direction through the circumscribed volume of the spatial passageway 40, which is limited by the x-dimensional distance 42 and the y-axis dimensional gap distance 44. Since the component of magnetic field $B_x$ is constrained by the ferromagnetic plane to be zero at the plane, it follows that $B_x$ may be non-zero at the center of the ion beam, and therefore at some distance downstream the shape of the beam may exhibit some bending in the y-direction. This would not be sufficient to prevent its use for adjusting and controlling the uniformity of the charged particles in the beam.

A particular feature of the arrangement illustrated by FIGS. 6 and 7 is that each wire coil 22 is wound on the ferromagnetic support rod 20 such that the coil extends outward from the support rod and physically restricts the size of the unobstructed spatial passageway 40. A plurality of individual magnetic field gradients of limited breadth are created by energizing each of the single coiled windings independently; and each of the independently created magnetic fields extends spatially outwards, orthogonally, in the y-axis dimension, into the gap distance 44 (i.e., into the pathway of the traveling ion beam).

A major benefit and advantage of the arrayed arrangement of FIGS. 6 and 7 is the formation of adjacent, but individually controllable magnetic field gradients of limited breadth which are aligned in series and which collectively form a contiguous parallel magnetic field. Each wire coil creates a zone of magnetic field gradient of limited breadth, but these collectively and cumulatively form a contiguous field which can cover and will be effective over the entire breadth distance 42 of the spatial passageway 40.

The thickness of the coils, and the reduction in the clear passage that this thickness causes, are necessary in order to create sufficient ampere turns per unit length of the rod to create the magnitude of field gradient required. Reducing the thickness of the coil would necessitate raising the current density in the coil to preserve the number of ampere turns and achieve a given field gradient. The power density in the coils rises extremely rapidly as its thickness is reduced. The thickness of the coils is determined by this consideration, and not from any fundamental electromagnetic or ion optical consideration.

Figure 8:
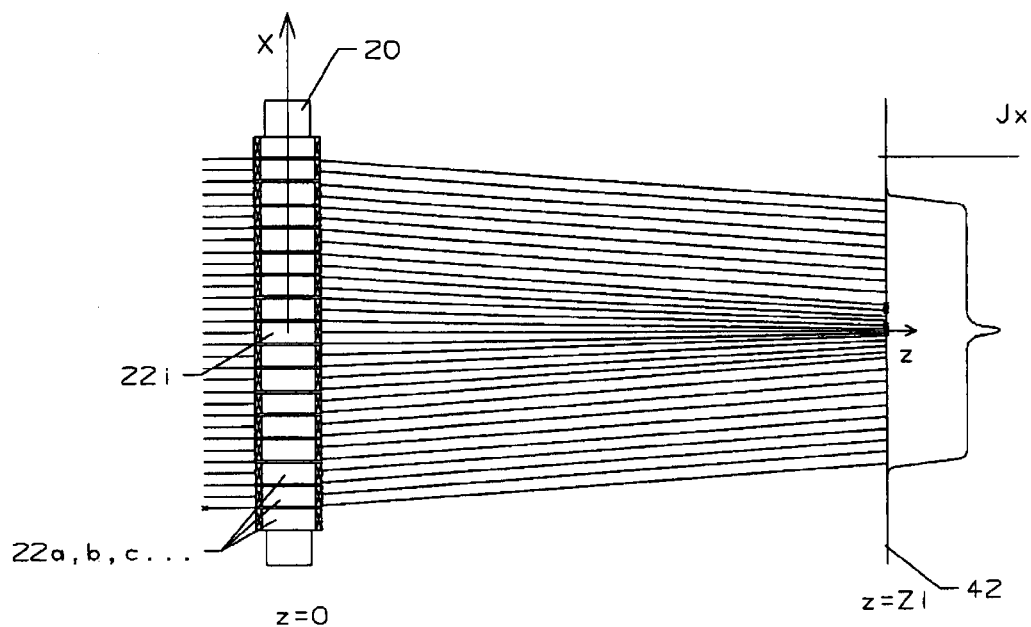
FIG. 8 shows the effect of exciting an individual coiled winding in the regulator assembly of FIG. 6 upon an ion beam that was otherwise uniform and parallel.

FIG. 8 illustrates the effect that the excitation of an individual coiled winding 22 would have on the current density distribution along the x-axis direction in an ion beam that was non-uniform in current density, but was parallel as to charged particle trajectory. FIG. 8, however, is merely illustrative of the long-recognized relationship existing between uniformity and parallelism of an ion beam.

The method of the present invention, however, begins with the converse situation and intends the reverse of the process of FIG. 8. This opposite effect and attainment of greater uniformity is shown by FIG. 9, where a parallel—but non-uniform—beam is adjusted and regulated to become more uniform at a target plane, and in which such greater uniformity of current density is achieved at the expense of the beam's parallelism.

Figure 9:
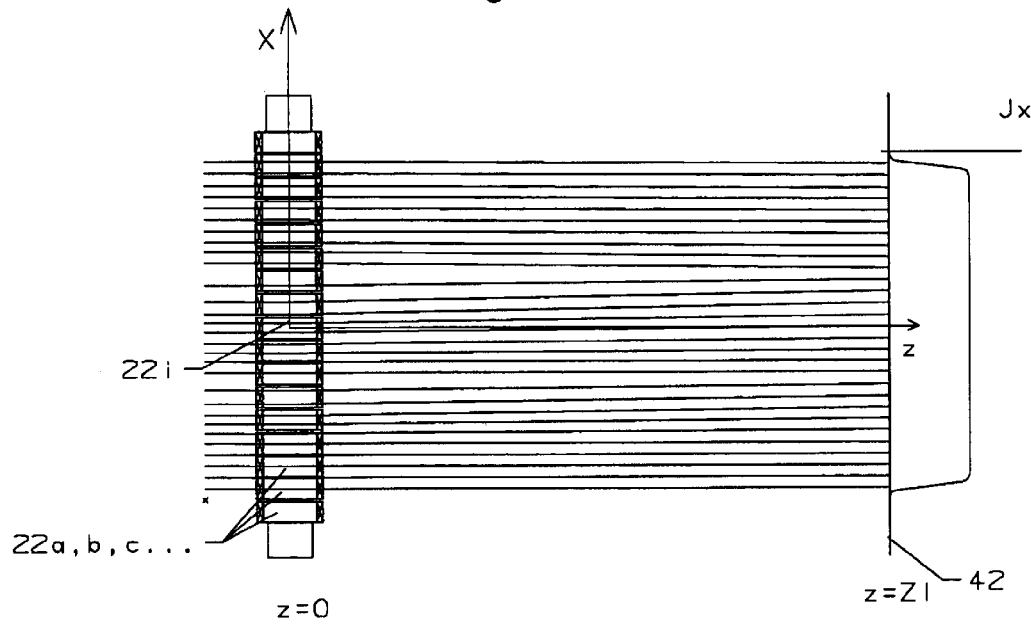
FIG. 9 shows the effect of the regulator assembly of FIGS. 6 and 7 where a parallel, but non-uniform, beam is rendered uniform at the expense of its parallelism.

As revealed by FIG. 9, the actual deflections of beam are small; and the focusing or defocusing effect must always be so small that the local focal length is greater than the gap distance from the multipole array to the targeted plane. Otherwise, the individual trajectories of the charged particles within the beam will cross; and such cross-over of charged particles will give rise to irrecoverable non-uniform features in the flowing beam.

Features and Limitations of the Simplest Construction

If one assumes that the simplest embodiment of the regulator assembly (comprising a single multipole coil array and a boundary plate and plane surface as described above) is employed and located at a travel distance of 500 mm from the target plane where the silicon wafers are to be implanted, then the focal length of any part of the regulator assembly should be significantly greater than this travel distance to avoid generating cusps and singularities in the current density.

Figure 10:
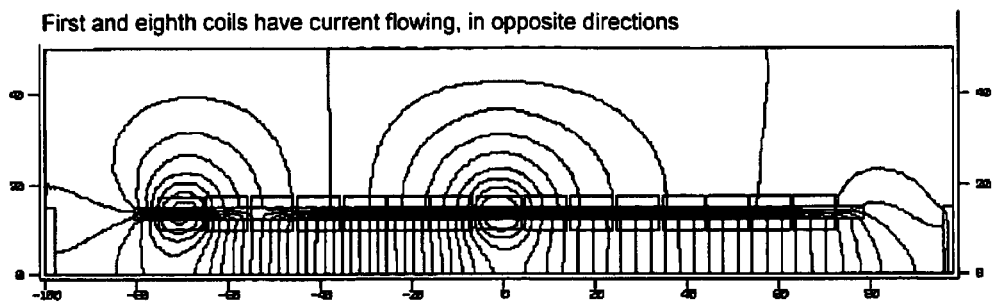
FIG. 10 is an illustration of the separation between the individual magnetic fields generated by two energized wire coils of the linear multipole array of the present invention.
Figure 11:
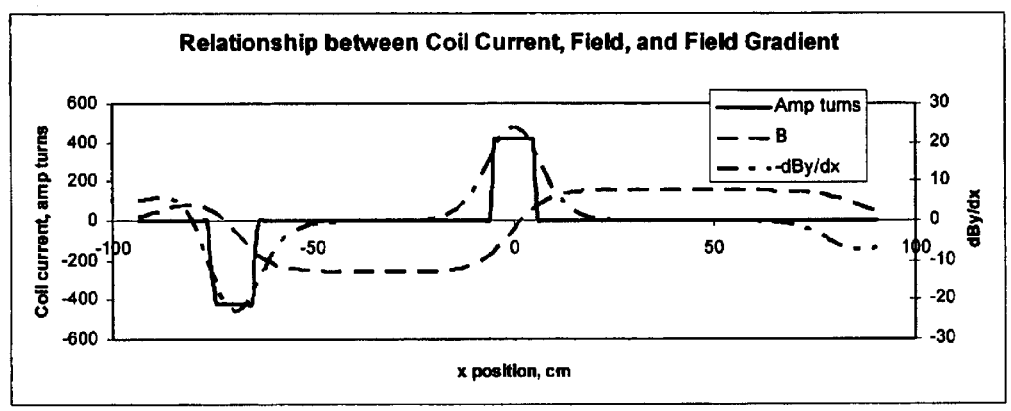
FIG. 11 is a graph showing the relationship between coil current, the field, and field gradient.
Figure 12:
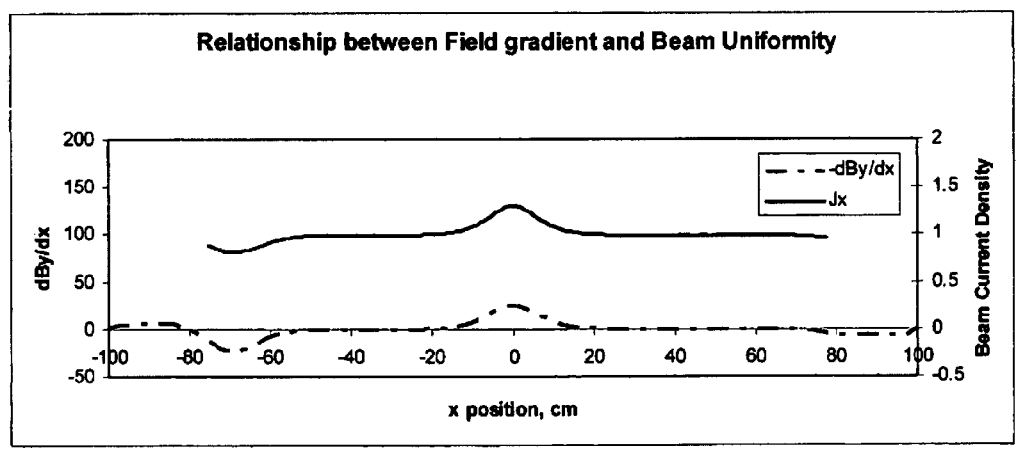
FIG. 12 is a graph showing the relationship between field gradient and beam uniformity.

On this basis also, the following relationships can be stated using standard electromagnetic theory [see also FIGS. 10, 11, and 12 respectively]:

The field gradient in the center of the device (assuming all the coils receive the same excitation current) within the beam is given by:

$$dB_y/dx = \mu_0 J_s/g$$

where g is the gap between the two ferromagnetic bars (or a single ferromagnetic bar and the ferromagnetic boundary plane), and $J_s$ is the number of ampere turns in the coil per unit length in the x-direction. When only one wire coil is excited, this expression approximates the peak gradient caused by this coil, provided the coil width exceeds g. If the coils are narrower, this relationship will hold, provided several adjacent coils are excited. The magnetic field required to deflect an ion of mass M, charge q and kinetic energy U on a trajectory with a radius ρ is given by $$B\rho = \frac{\sqrt{2mU}}{q}$$

Assume that the z-extent of the multipole device is defined by the overall z-extent of the coils—in reality, this may be slightly less and should be modeled with a finite element computer code for accuracy. This dimension is named $L_m$ and is not tightly constrained. For practical reasons one can assign it a value of 100 mm. Therefore the angle through which a given field B would deflect an ion of mass M passing though a device of effective length $L_m$ is $$\theta \approx L_m B \frac{q}{\sqrt{2MU}}$$

and the focal length is given by $$\frac{1}{f} = L_m \frac{\partial B_y}{\partial x} \frac{q}{\sqrt{2MU}} = \mu_0 L_m \frac{J_s}{g} \frac{q}{\sqrt{2MU}}$$

Assuming that the minimum focal length is about twice the distance $L_t$ from the center of the multipole to the target plane, an inequality can be written (in MKSA units) to limit the maximum magnitude of the current density in the coils, based only on the beam parameters and the physical layout. Assume further that the ionic charge is constant and that the ions are accelerated through a total DC potential V:

$$|J_s| < \frac{g}{2\mu_0 L_t L_m} \sqrt{\frac{2MV}{q}}$$

For g=0.06 m, $L_m$=0.2 m, $L_t$=0.5 m, and for arsenic at 100 keV, $J_s$=94178 ampere turns per meter, or about 94 ampere turns per mm.

This is an inequality, and a sufficient current density to provide at least +/−25% modulation of the current density can be obtained with less than half this. Nevertheless, assuming a coil depth of 15 mm, the current density required is 3 amps per sq. mm, which is a little too high for practical manufacture. The simplest embodiment as described above thus has limited capability for correcting the uniformity of a 100 keV arsenic ion beam within the stated dimensions.

B. A Preferred Construction

Structural Elements of the Preferred Construction

Figure 13:
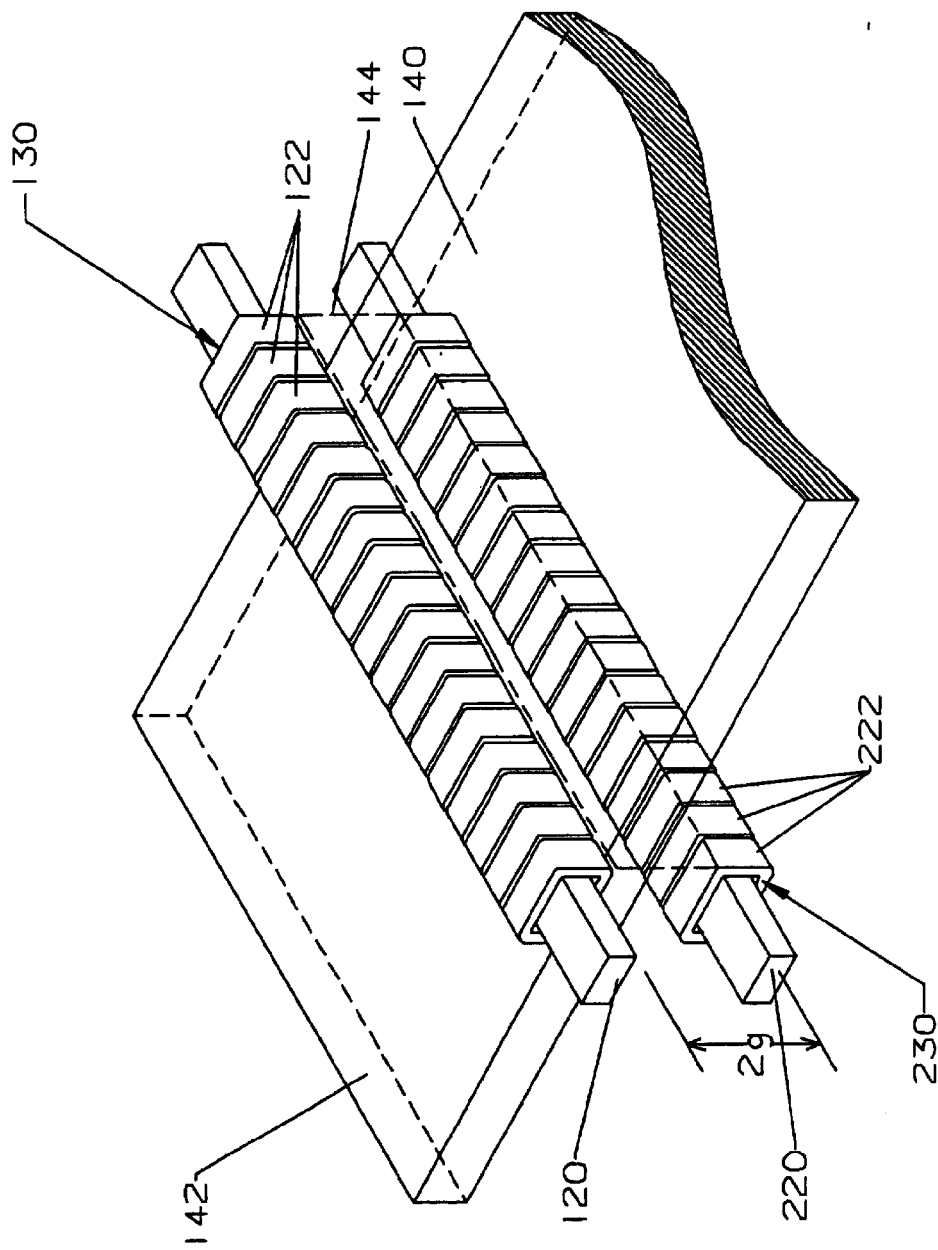
FIG. 13 shows a perspective view of a preferred construction of the present invention.
Figure 14:
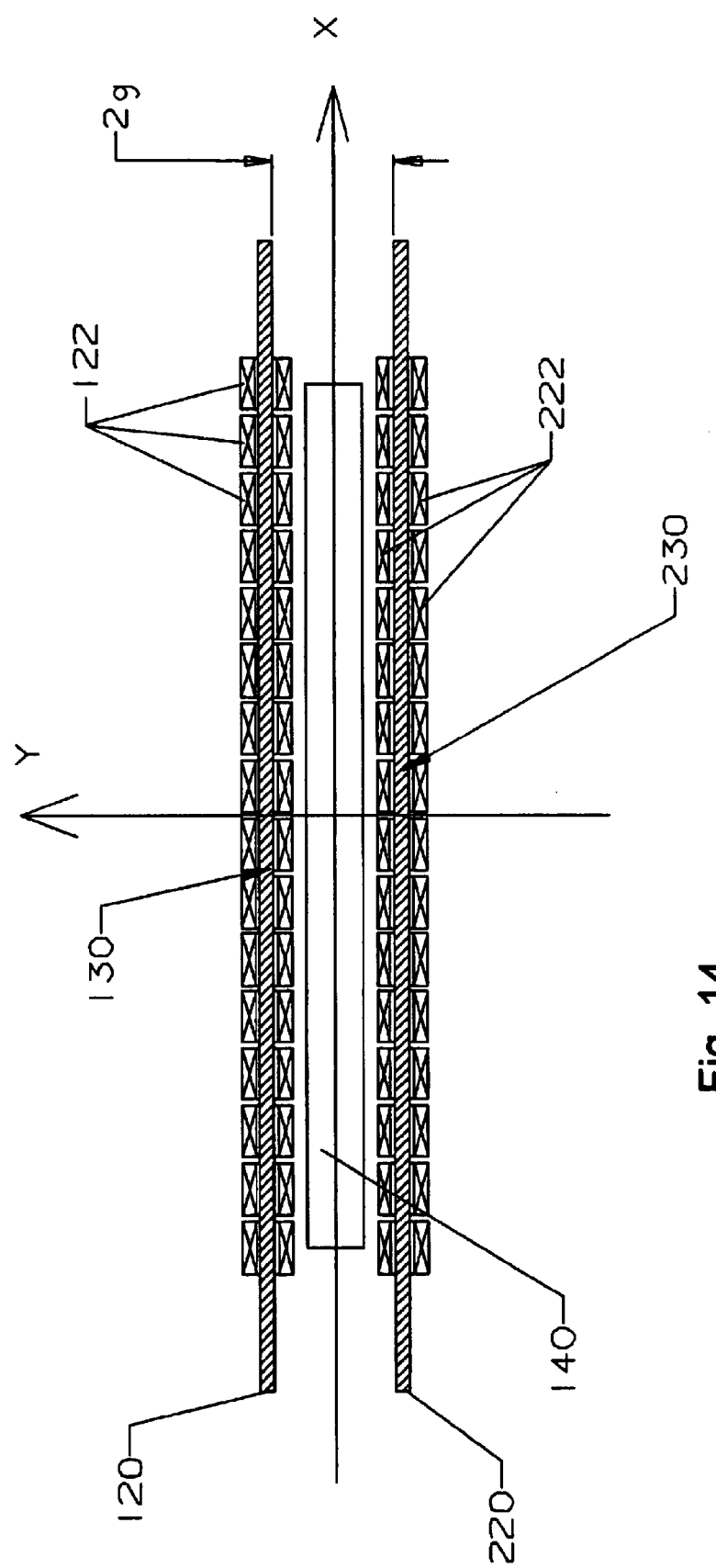
FIG. 14 shows another view of the preferred construction of FIG. 13 as seen from the direction of the ion beam.

A preferred embodiment of the present invention is illustrated by FIGS. 13 and 14. As seen therein, the regulator assembly comprises two ferromagnetic bars 120 and 220, each of which is sized to be somewhat longer in linear length than the x-dimension of the traveling ion beam intended to be controlled; and is oriented to lie parallel to and at a pre-chosen gap distance 144 from one another. Each ferromagnetic bar 120 and 220 serves as a straight supporting rod around which a plurality of individual wire coils 122 and 222 are orthogonally wound at a number of predetermined and different locations; and collectively create an axially aligned series of independent, separated, and adjacently located coiled windings; and form the first multipole coil array 130 and the second multipole coil array 230 respectively. The regulator assembly 110 thus comprises the first and second multipole arrays 130 and 230, which are positioned to lie parallel and in correspondence to one another while oriented along a commonly shared x-axis direction.

A component part of the overall regulator assembly are on-demand means (not shown) for introducing electrical energy of variable current (amperes) independently through each independent and adjacently positioned wire coil 122 and 222 which is orthogonally disposed along the fixed length of the support rods 120 and 220. Given the flow of electrical energy of an appropriate current, each adjacently positioned and energized wire coil 22 independently generates an orthogonally extending and individually adjustable magnetic field gradient of limited breadth; and the plurality of adjacently extending magnetic field gradients of limited breadth collectively merge to form a contiguous magnetic field; and the strength of each magnetic field of limited breadth within the contiguous magnetic field can be individually altered at will (by varying the electrical current) to yield an adjustable and controllable magnetic field gradient over the contiguous magnetic field.

The aligned series of independently and adjacently placed wire coils 122 and 222 on an individual ferromagnetic rod 120 and 220 comprising each the first and second multipole coil arrays 130 and 230 is congruent with (i.e., coincides exactly when superimposed) and encompasses the breadth dimension 142 of the circumscribed spatial passageway 140 through which the continuous ion beam travels in-situ. The multipole coil arrays 130 and 230 are typically positioned by means of non-magnetic supports to lie in parallel and in correspondence such that a preset gapped distance 144 exists and is maintained between the plurality of wire coils 122 and 222. The preset gap distance 144 defines two of the sides of the rectangular shaped passageway 140 into which the desired magnetic field is generated and applied. Each multipole coil array 130 and 230 provides a fixed ferromagnetic limit and boundary at which the magnetic field lines are constrained to be orthogonal. Accordingly, the spatial volume through which the charged particles of the continuous ion beam will travel (in the z-axis direction) is contained within and circumscribed by the breadth distance 142 (representing the x-axis dimension) and the set gap distance 144 (representing the y-axis dimension) of the spatial passageway 140.

If desired, vacuum walls of non-ferromagnetic material (not shown) may be interposed between the ion beam and the first and second linear multiple arrays. The placement of such vacuum walls is conventionally known; and the use of vacuum walls in this location is deemed to be an optional, but often desirable, feature of the ion implantation environment in which the present regulator assembly is to function and achieve its intended purposes.

Accordingly, in this preferred construction of FIGS. 13 and 14 respectively, the construct comprises two ferromagnetic bars mounted across the width of the beam on either side of it, and approximately centered on the plane y=0. A regular array of adjacently placed wire coils is orthogonally wound around each of the two iron bars; and each orthogonally oriented wire coil disposed on the first bar is located and aligned to lie opposite and in correspondence with another discrete wire coil wound orthogonally on the second bar. The oppositely situated pairs of coils are preferably placed in precisely coinciding alignment (exact reciprocal correspondence); or the oppositely situated pair of coils may alternatively and optionally be placed in staggered alignment position (offset reciprocal correspondence). The total number of wire coils forming the array will vary and depend on the expected circumference or girth of the ion beam; but should be least four (4) wound coils in number, and often will exceed thirty (30) adjacently positioned coils disposed upon a ferromagnetic bar.

Each of wire coils 122 is typically electrically joined in common with its directly opposite counterpart wire coil 222 when they are placed in precisely coinciding alignment; however, the oppositely situated coils cannot be directly electrically joined together in those alternative embodiments where the pair of wire coils are disposed in staggered correspondence. Nevertheless, in all instances, each distanced set of oppositely situated wire coils is to be energized equally as a matched pair (i.e., receive the same amount of electrical current), one on each side of the spatial passageway 140, with the electric current flowing around each coil of the matched pair in the same angular sense or direction. The pitch of the wire coils across the breadth dimension 42 of the spatial passageway 140 should therefore be less than g/2 for optimum control of $dB_y/dx$; but since the number of independent power sources increases as the pitch of the wire coils is reduced, the overall cost and complexity of wiring for the assembly become decisive factors and practical considerations.

Using the constructed regulator assembly of FIGS. 13 and 14, the amperage current which is passed into each electrically joined pair of oppositely situated wire coils (then disposed upon each of the first and second multipole coil arrays) may be independently adjusted and individually controlled. Thus, in those multipole array embodiments of the invention which typically employ between four (4) and thirty (30) wire coils per array, there will be between four and thirty matched pairs of oppositely situated wire coils electrically joined in common; and between four and thirty separate electrical connections which provide differing individual amperages to each matched pair of oppositely situated coils disposed on the array.

In addition, the individual pairs of oppositely situated wire coils placed closest to the ends of the ferromagnetic rods may be located just beyond the confines of the ion beam width; and the ends of the supporting rods in each multipole array can be increased in length beyond the last of the wire coils by an extension sufficient to ensure that the effects of the rod ends on the distribution of the magnetic field applied to the ion beam are insignificant. The size of this rod end extension will typically be at least twice the size of the set gap distance separating the first and second multipole arrays.

Moreover, if ferromagnetic material is used to connect the two ferromagnetic rods at their individual ends to form a complete magnetic yoke (as in conventionally known devices), then it is essential to place additional large wire coils on these short rod ends, which will then carry electric currents (amperages) equal to the algebraic sum of the currents in each multipole coil array, but in an electrically opposing sense or field direction. The effect on the central magnetic field profile is insignificant, provided the additional large wire coils on the support rod ends extend well beyond the actual width of the ion beam. The stray magnetic field which may occur at some distance from the arrayed structure is somewhat greater in effect, but this flaw can be controlled with magnetic shielding (the discussion of which is outside the scope of this invention).

Thus, the consistency of the magnetic field gradient in the central region of the regulator assembly is determined by the consistency and electrical equality of the current amperage given to each pair of oppositely situated wire coils. Near the ends of each array, the magnetic gradient falls to zero and then reverses; for this reason, therefore, the disposition of the wire coils on each array must extend beyond the region in which the desired field profile must be maintained. This premise assumes that sufficient iron or steel is present in the two rod lengths of the arrays such that this material does not magnetically saturate; and this, in turn, determines the maximum x-dimensional extent and excitation level of the first and second arrays comprising the regulator assembly.

Other Characteristics

In the preferred embodiment described herein, the ferromagnetic boundary plate and plane surface of the simplest construction is dispensed with and a second multipole coil array with multiple independent and adjacently placed wire coils is situated to lie in parallel and in correspondence with the first. The first and second multipole coil arrays are separated by a total distance 2 g, and the same equations stated above for the simplest construction apply.

However, the preferred embodiment of FIGS. 13 and 14 has the advantage that if the same travel space is available for the beam, the gap distance "g" is less and the amperage current in each wire coils less. More wire coils are required; but-in the midplane of each array, the field component $B_x$ is zero, which minimizes unwanted effects on the beam shape. The corresponding coils can be connected in series, provided that care is taken to reverse the sense of the current in the opposing coil.

Also, for either the simplest embodiments and/or the preferred embodiments of the present invention, certain features and attributes are deemed to be very desirable. These include: that the current introduced to the wire coils of a multipole coil array range from about 50 to 10,000 ampere turns; that the preset gap distance of the spatial passageway be a dimension varying from about 25 to 250 millimeters; and that the breadth dimension of the spatial passageway vary in size from about 200 to 2,000 millimeters.

C. Alternative Constructions

Alternative constructions and embodiments of the present invention can also be made which provide higher magnetic fields for continuous ion beams of higher magnetic rigidity. Such alternative formats are based on the following:

The required current density per unit length is proportional to the gap distance between the two oppositely situated sets of ferromagnetic rods supporting the first and second multipole coil arrays in the assembly (or in the case of the simplest embodiment, the one ferromagnetic rod and the ferromagnetic boundary plate having a plane surface). If the required current density is too high, it will force each wire coil positioned on the rod of the array to be wound thicker, which in turn forces the proper gap distance between the ferromagnetic components to increase. Provided that the each wire coil winding is significantly thinner than the set gap distance of the spatial passageway, there is a gain in magnetic field—but as the wire coil is wound thicker, there is a diminishing return. This problem can be partially solved, at the expense of smoothness in the magnetic field gradient, by using the following technique.

Figure 15:
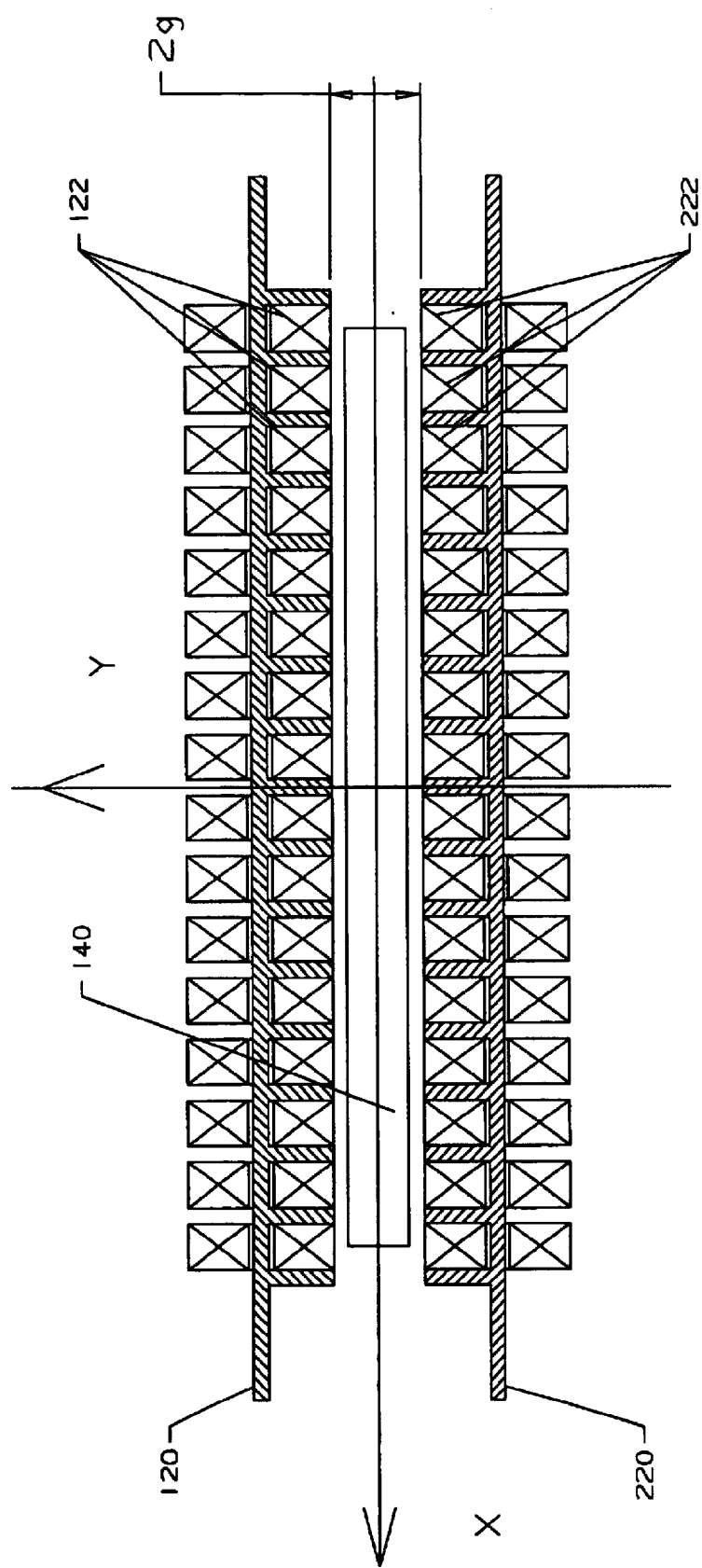
FIG. 15 illustrates the arrangement where a ferromagnetic spacer is used to separate each of the adjacently positioned wire coils of the linear multipole array.

Ideally, the coils of the multipole coil arrays are not separated by gaps. However, while the practical necessity of introducing gaps between the coils is unavoidable, the intentional filling of such gaps with steel or other ferromagnetic material can allow the rods to be moved apart without increasing the gap distance between ferromagnetic components. This approach will increase the magnetic field directly, while also allowing more space for the wire coils. Thus, each wire coil disposed on the support road is purposely separated by an intervening steel spacer, which extends to the edges of the next adjacently positioned wire coil of the array. FIG. 15 illustrates the intervening steel spacer arrangement for the wire coils disposed on the support rods of the first and second arrays.

The type of alternative embodiment shown by FIG. 15 is also deemed to be effective for continuous ion beams of the highest magnetic rigidity. In these instances, the ferromagnetic material employed as a spacer (typically steel) must be of sufficient thickness that it does not saturate; and the pitch of the spacer must be short and small enough that the magnetic non-uniformity produced by the finite thickness of the straight support rod and spacer is not excessive. Thus, the magnetic non-uniformity is proportional to the square of the pitch of the wire coils and of the thickness of the intervening spacers.

IV. Adjustment Steps of a Method for Improving the Uniformity of a Continuous Ribbon Beam The following method of improving the uniformity of a continuous ribbon beam will be seen to be a great simplification over the method described in the White AIP reference cited above. These steps are performed prior to passing a workpiece through the ion beam. The method is described for the preferred embodiment alone, for clarity, but can be readily adapted for use in the other embodiments.

Methods of measuring the beam current density profile have been discussed; for ease of understanding we here assume that an array of identical Faraday cups is placed in the target plane. To eliminate errors, each Faraday cup should be preceded by a grounded entrance aperture of rectangular shape, the width of each aperture being accurately identical, and having a width which is a fraction of the width of each coil of the multipole array. The height of each aperture and of the Faraday cup must exceed that of the ion beam, or the measurement will be invalid. One Faraday cup is centered on every x-coordinate at which a coil or pair of coils is centered in the multipole assembly. Current density at an x-coordinate is obtained by dividing the measured ion beam current by the width of the aperture; however if all apertures are identical this step can be omitted, and the measured currents can be used directly.

After the measurement is complete, the mean value of the measured currents in the Faraday cups is computed. If the desired beam profile is uniform, the error at each measurement point is the difference between the measured value and the mean. If the desired beam profile is non-uniform, then the error value must be computed to suit the desired function.

The method consists of the following steps:

(i) A stable ion beam of the desired species, energy, and approximate current is directed on its intended path through the ion implanter to the target plane.

(ii) The profile of the ion beam is measured.

(iii) Commencing with the first Faraday cup, the current passed through the first coil or coils is adjusted so as change the observed current on the first Faraday cup until it matches the desired current (the mean value in the case of a uniform profile). The adjustment may be made by the standard empirical method of making a small change to the controlling parameter (current in the coil) in order to estimate the appropriate direction and magnitude of change that is required. However, once the system has been tested and calibrated, both these quantities should be known, and their dependence on ion species and energy is also well-known. After adjusting the first coil, the ion beam current in the second Faraday cup is adjusted by means of the current in the second coil, and so on.

(iv) If necessary, steps ii and iii are repeated.

It will be observed that, apart from the calculation of the mean value, this procedure consists of adjusting one control parameter at a time until a measurement of a variable achieves a desired value. This is a linear process, and can easily be accomplished manually. The prior art method cited for the prior art multipoles for uniformity control involved intensive computation and was beyond the capabilities of most skilled operators to perform manually.

This procedure is readily automated, since it is linear and scalable. There will be some crosstalk between adjacent coils, which may necessitate repeating the procedure, or even modifying it so that each repetition of the procedure undercorrects the observed errors. It can therefore be very fast when implemented automatically.

V. Additional Details and Characteristics of the Regulator Assembly

1. In an apparatus intended for the implantation of ion species (including arsenic and lighter species) into silicon wafers at energies up to 100 keV, the ion beam would be slightly greater than 300 mm in its x-axis dimension (since the largest standard diameter for commercial silicon wafers in use today is 300 mm), and would probably be about 30 mm in its y-axis dimension. The wafer must be fully traversed through the beam in the y-dimension. Too small a y-axis dimension would raise the current and power density in the beam to undesirable levels; while too great a y-axis dimension would increase the required distance through which the wafer must travel in order to clear the peripheral edges of the beam, and would reduce the productivity of the system. For these reasons, the optimum beam height is estimated to be between 10% and 20% of the beam width.

2. It should be clearly understood that the magnetic field gradient cannot be controlled over distances smaller than the x-dimension pitch of the wire coils. It should also be recognized that the y-dimension of the beam is of similar magnitude to the minimum gap distance for the assembly over which the field gradient can be reliably controlled. In a particular instance, modeling using a freely available code such as POISSON (Los Alamos, Poisson Superfish Version 7 available on the LAACG FTP servers) can be used to provide greater precision to these statements.

3. One can also expect the pitch of the wire coils to be similar to the beam y-dimension. Similarly, the winding thickness of the wire coil typically should be significantly less than the pitch. However, some alternative embodiments will utilize substantially larger coiled windings for particular applications and implanting systems.

4. In the past, the apparatus formed a complete magnetic path around the ion beam. It is a fundamental feature of the present invention that the ends of the ferromagnetic bars supporting the array of coiled windings are not connected by a ferromagnetic metal such as steel. This feature enables non-zero field components to exist at the ends of each multipole array. As a result, the stray fields from this assembly may be greater than for prior art devices, but the stray fields may be greatly reduced by placing steel shunts near the ends of the present multipoles, no closer than g to each end.

Figure 16:
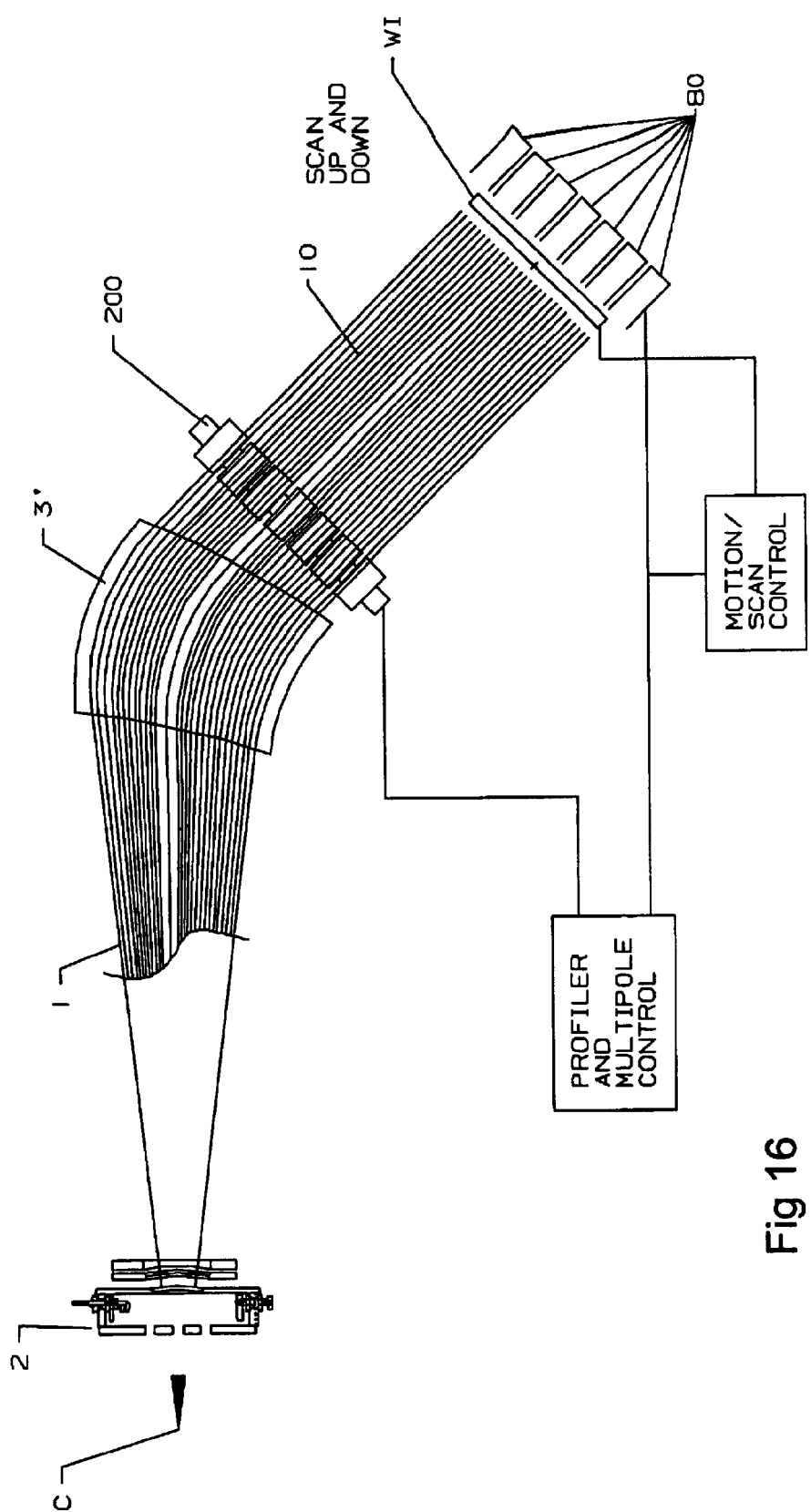
FIG. 16 shows the incorporation of the present invention into a conventionally known ion implanter device.

5. Embodiments of the present invention may be incorporated into any conventionally known ion implanter, such as that shown in U.S. Pat. No. 5,834,786, as shown by FIG. 16 where it appears as item 200. It may advantageously be placed on the other side of the magnet 3' from the multipole position disclosed, where the beam width is slightly greater; but still is as distant as possible from the target plane WI. A divergent ion beam 1 is produced by the ion source 2 and rendered parallel within about 0.2 degrees by the magnet. The multipole arrayed assembly may be then adjusted by the Profiler and Multipole control to equalize the currents in each of the Faraday cups, with the implant target removed from the beam.

6. The ion beam uniformity can be measured by means of a traveling Faraday cup or by an array of discrete Faraday cups. For simplicity, however, an array of Faraday cups equal to half the number of coils, and aligned with the coils, can be placed in the target plane, or close behind it. The aperture of each cup is accurately the same, so that equal measurements in the cups represent a uniform ion beam. It is important that the acceptance of the measuring device in the y-direction receives the entire beam. Accuracy is compromised if the defining apertures of the measuring device are not in the target plane. Once can choose between placing the profiler hardware directly in the target plane, in which case interlocked mechanisms are required to prevent a collision between the workpiece and the profiler hardware, or placing it just behind the target plane and accepting a slight degradation in uniformity. The error is proportional to the strongest quadrupole field component generated by the multipole adjuster.

7. Embodiments of the invention may also be incorporated into an ion implanter for silicon wafers. Compared to prior art systems (including that disclosed by U.S. Pat. No. 5,350,926), the beam trimmer, movable pole pieces and associated controls all have now been removed. In their place is a multipole arrayed assembly of the type described above, and an aligned array of Faraday cups for measuring the beam uniformity when the workpiece is removed from the target plane. A divergent ion beam, produced by an ion source is mass-analyzed by a magnet and rendered parallel within about 0.2 degrees by a magnet. The multipole arrayed assembly may degrade the parallelism by about +/−0.3 degrees in practice. Note that it would be possible to use the original traveling Faraday cup profiler system instead of the Faraday cups, and it may also be more accurate and less expensive—but a practical operation using multiple Faraday cups is far simpler to use.

8. The prior art (particularly as exemplified by U.S. Pat. No. 5,834,786) provided a method of adjusting current density via a Cartesian array of controllable dipole electromagnets. This was necessary because there was no simple relationship between the setting of each coil current in that multipole system and the resulting uniformity. This system is described more fully in "Positive Control of Uniformity in Ribbon Beams for Implantation of Flat-Panel Displays" by White et al, IIT-98, IEEE, 1999.

The present invention, however, simplifies the current uniformity adjustment process because a direct relationship now exists between electrical energy in the individual wire coils (the simplest construction) or the matched pairs of oppositely situated wire coils of the multipole coil arrays (in the preferred construction) and the beam's ion density at the target plane. An adjustment of the beam's current uniformity can be accomplished by adjusting each pair of matched wire coils disposed over the length of the first and second multipole arrays in turn until the current in the corresponding Faraday cup has the desired value, typically the mean value of the profile prior to adjustment. Because of the finite region of influence of each multipole array in the assembly, some iteration of tuning may be required. In the event that the overall profile is wider or narrower than desired, the target value can be raised or lowered respectively by a proportionate amount.

9. In another variant format, it is possible to reduce the total number of coils at the expense of very slight increase in unwanted $B_x$ components by offsetting the coils on one bar in the positive x-direction by ¼ of the pitch of the coils, and offsetting the coils on the other bar in the negative x-direction by the same amount. In this way the center of a coil on one bar is opposite the edge of a coil on the opposite bar, and vice versa. The width of each coil may be doubled without significantly reducing the resolution with which the field gradient can be modified, provided that every coil can be individually adjusted.

The present invention is not to be limited in scope nor restricted in form except by the claims appended hereto:

What I claim is:

1. In an ion implanter apparatus including a source for the generation of charged particles as a continuous ion beam, means for directing the continuous ion beam in a desired direction, and a plane surface for the implantation of charged particles in the continuous ion beam into a prepared workpiece, the improvement of an electromagnetic regulator assembly for adjusting and controlling the uniformity of charged particles in a continuous ion beam, said regulator assembly comprising:

a multipole coil array comprised of
(i) a straight support rod comprising ferromagnetic material and having a predetermined length and girth, and
(ii) at least two wire coils disposed individually, orthogonally, and adjacently at pre-chosen sites on said support rod, each of said wire coils being formed of electrically conductive matter;

a boundary plate presenting a planar surface which is positioned to lie parallel to and at a preset gap distance from said multipole coil array, said boundary plate being of predetermined dimensions and configuration and comprising ferromagnetic material;

means for introducing electrical energy individually to each wire coil disposed on said support rod;

an electric current controller for the independent adjustment and control of the electrical energy introduced individually to each wire coil disposed on said support rod of said array, whereby each energized wire coil generates an orthogonally extending and current adjusted magnetic field gradient of limited breadth, and whereby a plurality of said orthogonally extending and current adjusted magnetic field gradients of limited breadth collectively form a contiguous magnetic field having a customized magnetic field gradient, and whereby the application of said customized magnetic field gradient of said contiguous magnetic field will increase the uniformity of charged particles in a continuous ion beam; and a circumscribed spatial passageway for applying said contiguous magnetic field having a customized magnetic field gradient to a continuous ion beam traveling therethrough, wherein said spatial passageway is dimensionally circumscribed in an x-axis direction by the length of said multipole coil array and in a y-axis direction by a preset gap distance separating said multipole array from said plane surface of said boundary plate, and wherein the degree of uniformity for the charged particles of a continuous ion beam becomes increased.

2. In an ion implanter apparatus including a source for the generation of charged particles as a continuous ion beam, means for directing the continuous ion beam in a desired direction, and a plane surface for the implantation of charged particles in the continuous ion beam into a prepared workpiece, the improvement of an electromagnetic regulator assembly for adjusting and controlling the uniformity of charged particles in a continuous ion beam, said regulator assembly comprising:

a first multipole coil array comprised of
(i) a straight support rod comprising ferromagnetic material and having a fixed length and girth, and
(ii) at least two wire coils wound independently and positioned adjacently at pre-chosen sites on said support rod, each of said wire coils being formed of electrically conductive matter and being wound to lie orthogonal to said straight support road;

a second multipole coil array which is positioned parallel to, is in correspondence with the wire coils of, and lies at a preset gap distance from said first multipole coil array, said second multipole coil array being comprised of
(a) a straight support rod comprising ferromagnetic material and having a fixed length and girth, and
(b) at least two wire coils wound independently and positioned adjacently at pre-chosen sites on said support rod, each of said wire coils being formed of electrically conductive matter and being wound to lie orthogonal to said straight support road;

on-demand means for passing electrical energy of variable current independently and concurrently through each adjacently positioned wire coil on said each of said support rods of said first and second multipole arrays, whereby each adjacently positioned and energized wire coil independently and concurrently generates an orthogonally extending and individually adjustable magnetic field gradient of limited breadth between said first and second multipole coil arrays, and whereby said plurality of adjacently extending magnetic field gradients of limited breadth collectively form a contiguous magnetic field between said first and second multipole coil arrays, and whereby each magnetic field gradient of limited breadth within said contiguous magnetic field can be individually and concurrently altered at will to yield an adjustable and controllable magnetic field gradient over said contiguous magnetic field;

a circumscribed spatial passageway existing between said first and second multipole coil arrays for applying a contiguous magnetic field to and adjusting and controlling the magnetic field gradient of an applied contiguous magnetic field for a continuous ion beam traveling therethrough, wherein said spatial passageway is dimensionally circumscribed in a x-axis direction by the length of said first and second multipole coil arrays, and in a y-axis direction by said preset gap distance separating said first multipole coil array from said second multipole coil array, and wherein the degree of uniformity for the charged particles of a continuous ion beam becomes adjusted and controlled.

3. The regulator apparatus as recited by claim 1 or 2 wherein said continuous ion beam is a ribbon-shaped beam.

4. The regulator apparatus as recited by claim 1 or 2 wherein the number of said wire coils wound independently and positioned adjacently at pre-chosen sites on a support rod ranges between four and thirty.

5. The regulator assembly recited by claim 1 or 2 further comprising a means of measuring the profile of the current density of the ion beam in its long dimension at the plane where the workpiece is to be implanted, by measuring the current at a plurality of positions including those positions having the same x-coordinates as each of the coils of the multipole array, said measuring means extending beyond the beam edges in its narrow dimension but being restricted in the direction of the large dimension of the ion beam to less than the width of one of the coils in the multipole coil arrays.

6. The regulator assembly as recited by claim 5 wherein the means of passing variable electrical current are adjusted in response to the measurement of the current density profile, so as to modify the observed ion beam current density profile at the corresponding location in the target plane until that current density conforms to a desired profile.

7. The regulator apparatus as recited by claim 1 or 2 wherein the current introduced to said wire coils of said multipole coil array ranges from 50 to 10,000 ampere turns.

8. The regulator apparatus as recited by claim 1 or 2 wherein said preset gap distance of said spatial passageway is a dimension varying from 25 to 250 millimeters.

9. The regulator apparatus as recited by claim 1 or 2 wherein said breadth dimension of said spatial passageway varies from 200 to 2,000 millimeters.

10. A method for adjusting and controlling the uniformity of charged particles in a continuous ion beam, said method comprising the steps of:

obtaining a regulator assembly comprised of
a multipole coil array comprised of
(i) a straight support rod comprising ferromagnetic material and having a predetermined length and girth, and
(ii) at least two wire coils wound independently and positioned adjacently at pre-chosen sites on said support rod, each of said wire coils being formed of electrically conductive matter and being wound to lie orthogonal to said straight support road,
a boundary plate presenting a planar surface which is positioned to lie parallel to and at a preset gap distance from said multipole coil array, said boundary plate being of predetermined dimensions and configuration and comprising ferromagnetic material,
on-demand means for passing electrical energy of variable current independently through each adjacently positioned wire coil on said support rod such that each adjacently positioned and energized wire coil independently is able to generate an orthogonally extending and individually adjustable magnetic field gradient of limited breadth, and said plurality of adjacently extending magnetic field gradients of limited breadth will collectively form a contiguous magnetic field, and each magnetic field gradient of limited breadth within said contiguous magnetic field is able to be individually altered at will to yield an adjustable and controllable magnetic field gradient over said contiguous magnetic field, and
a circumscribed spatial passageway for applying a contiguous magnetic field to and adjusting and controlling the magnetic field gradient of an applied contiguous magnetic field for a continuous ion beam traveling therethrough, wherein said spatial passageway is dimensionally circumscribed in an x-axis direction by said length of said support rod of said multipole coil array and in a y-axis direction by said gap distance separating said multipole array from said plane surface of said boundary plate;
directing a continuous ion beam through said spatial passageway of said electromagnetic regulator assembly;
passing electrical energy of variable current independently through each adjacently positioned wire coil on said support rod, whereby each adjacently positioned and energized wire coil independently generates an orthogonally extending and individually adjustable magnetic field of limited breadth, and whereby said plurality of adjacently extending magnetic fields of limited breadth collectively form a contiguous magnetic field, and whereby each magnetic field of limited breadth within said contiguous magnetic field can be individually altered at will to yield an adjustable and controllable magnetic field gradient over said contiguous magnetic field; and
adjusting and controlling the degree of uniformity for the charged particles of a continuous ion beam passing through said electromagnetic regular assembly.

11. A method for adjusting and controlling the uniformity of charged particles in a continuous ion beam, said method comprising the steps of:
obtaining a regulator assembly comprised of:
a first multipole coil array comprising
(i) a straight support rod comprising ferromagnetic material and having a fixed length and girth, and
(ii) at least two wire coils wound independently and positioned adjacently at pre-chosen sites on said support rod, each of said wire coils being formed of electrically conductive matter and being wound to lie orthogonal to said straight support road,
a second multipole coil array which is positioned parallel to, is in correspondence with the wire coils of, and lies at a preset gap distance from said first multipole coil array, said second multipole coil array comprising
(a) a straight support rod comprising ferromagnetic material and having a fixed length and girth, and
(b) at least two wire coils wound independently and positioned adjacently at pre-chosen sites on said support rod, each of said wire coils being formed of electrically conductive matter and being wound to lie orthogonal to said straight support road,
on-demand means for passing electrical energy of variable current independently and concurrently through each adjacently positioned wire coil on said each of said support rods of said first and second multipole arrays, such that each adjacently positioned and energized wire coil independently and concurrently is able to generate an orthogonally extending and individually adjustable magnetic field gradient of limited breadth between said first and second multipole coil arrays, and said plurality of adjacently extending magnetic field gradients of limited breadth collectively form a contiguous magnetic field between said first and second multipole coil arrays, and each magnetic field gradient of limited breadth within said contiguous magnetic field is able to be individually and concurrently altered at will to yield an adjustable and controllable magnetic field gradient over said contiguous magnetic field, and
a circumscribed spatial passageway existing between said first and second multipole coil arrays for applying a contiguous magnetic field to and adjusting and controlling the magnetic field gradient of an applied contiguous magnetic field for a continuous ion beam traveling therethrough, wherein said spatial passageway is dimensionally circumscribed in a x-axis direction by said fixed length of said support rods of said first and second multipole coil arrays, and in a y-axis direction by said preset gap distance separating said first multipole coil array from said second multipole coil array;
directing a continuous ion beam through said spatial passageway of said electromagnetic regulator assembly;
passing electrical energy of variable current independently and concurrently through each adjacently positioned wire coil on said each of said support rods of said first and second multipole arrays, whereby each adjacently positioned and energized wire coil independently and concurrently generates an orthogonally extending and individually adjustable magnetic field of limited breadth between said first and second multipole coil arrays, and whereby said plurality of adjacently extending magnetic fields of limited breadth collectively form a contiguous magnetic field between said first and second multipole coil arrays, and whereby each magnetic field of limited breadth within said contiguous magnetic field can be individually and concurrently altered at will to yield an adjustable and controllable magnetic field gradient over said contiguous magnetic field; and
adjusting and controlling the degree of uniformity for the charged particles of a continuous ion beam passing through said electromagnetic regular assembly.

* * * * *

UNITED STATES PATENT AND TRADEMARK OFFICE
CERTIFICATE OF CORRECTION

| | | |
|---|---|---|
| PATENT NO. | : 7,078,713 B2 | Page 1 of 1 |
| APPLICATION NO. | : 10/807770 | |
| DATED | : July 18, 2006 | |
| INVENTOR(S) | : Nicholas R. White | |

It is certified that error appears in the above-identified patent and that said Letters Patent is hereby corrected as shown below:

Title Page

Item (60), Related U.S. Application Data, should read:

--Provisional application No. 60/458,672, filed on Mar. 28, 2003.--.

At column 1, line 10, delete "Jul. 24, 2003" and insert --Mar. 28, 2003--.

Signed and Sealed this

Twenty-first Day of October, 2008

JON W. DUDAS
*Director of the United States Patent and Trademark Office*